(12) United States Patent
Cheng et al.

(10) Patent No.: US 8,772,747 B2
(45) Date of Patent: Jul. 8, 2014

(54) COMPOSITE TARGET SPUTTERING FOR FORMING DOPED PHASE CHANGE MATERIALS

(71) Applicant: Macronix International Co., Ltd., Hsinchu (TW)

(72) Inventors: Huai-Yu Cheng, White Plains, NY (US); Chieh-Fang Chen, Taipei (TW); Hsiang-Lan Lung, Ardsley, NY (US); Yen-Hao Shih, Elmsford, NY (US); Simone Raoux, New York, NY (US); Matthew J. Breitwisch, Pound Ridge, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/867,525

(22) Filed: Apr. 22, 2013

(65) Prior Publication Data

US 2013/0234093 A1 Sep. 12, 2013

Related U.S. Application Data

(62) Division of application No. 13/076,169, filed on Mar. 30, 2011, now Pat. No. 8,426,242.

(60) Provisional application No. 61/438,569, filed on Feb. 1, 2011.

(51) Int. Cl.
 *H01L 47/00* (2006.01)

(52) U.S. Cl.
 USPC .......................................................... 257/2

(58) Field of Classification Search
 USPC ............................. 257/2; 204/298.12, 298.13
 See application file for complete search history.

(56) References Cited

U.S. PATENT DOCUMENTS

| | | | |
|---|---|---|---|
| 4,177,475 A | 12/1979 | Holmberg | |
| 5,596,522 A | 1/1997 | Ovshinsky et al. | |
| 5,687,112 A | 11/1997 | Ovshinsky | |
| 5,825,046 A | 10/1998 | Czubatyj et al. | |
| 6,087,674 A | 7/2000 | Ovshinsky et al. | |
| 6,800,504 B2 | 10/2004 | Li et al. | |
| 7,355,238 B2 | 4/2008 | Takata et al. | |
| 7,453,081 B2 | 11/2008 | Happ et al. | |
| 7,501,648 B2 | 3/2009 | Chen et al. | |
| 7,759,770 B2 | 7/2010 | Happ et al. | |

(Continued)

OTHER PUBLICATIONS

Czubatyj et al., "Current Reduction in Ovonic Memory Devices," E*PCOS06 (2006).

(Continued)

*Primary Examiner* — Kevin M Picardat
(74) *Attorney, Agent, or Firm* — Haynes Beffel & Wolfeld LLP (57) ABSTRACT

A layer of phase change material with silicon or another semiconductor, or a silicon-based or other semiconductor-based additive, is formed using a composite sputter target including the silicon or other semiconductor, and the phase change material. The concentration of silicon or other semiconductor is more than five times greater than the specified concentration of silicon or other semiconductor in the layer being formed. For silicon-based additive in GST-type phase change materials, sputter target may comprise more than 40 at % silicon. Silicon-based or other semiconductor-based additives can be formed using the composite sputter target with a flow of reactive gases, such as oxygen or nitrogen, in the sputter chamber during the deposition.

10 Claims, 9 Drawing Sheets

(56) References Cited

U.S. PATENT DOCUMENTS

| | | |
|---|---|---|
| 8,178,405 B2 | 5/2012 | Lai et al. |
| 8,192,592 B2 | 6/2012 | Kim et al. |
| 8,426,242 B2 | 4/2013 | Cheng et al. |
| 2003/0186504 A1 | 10/2003 | Li et al. |
| 2004/0109351 A1 | 6/2004 | Morimoto et al. |
| 2005/0029502 A1 | 2/2005 | Hudgens |
| 2006/0043354 A1 | 3/2006 | Pinnow et al. |
| 2006/0049447 A1 | 3/2006 | Lee et al. |
| 2006/0126423 A1 | 6/2006 | Aratani et al. |
| 2006/0249369 A1 | 11/2006 | Marangon et al. |
| 2007/0029606 A1 | 2/2007 | Noh et al. |
| 2007/0097739 A1 | 5/2007 | Happ et al. |
| 2007/0267721 A1 | 11/2007 | Kuh et al. |
| 2009/0065351 A1 | 3/2009 | Nuss |
| 2009/0072215 A1 | 3/2009 | Lung et al. |
| 2009/0078924 A1 | 3/2009 | Liang et al. |
| 2009/0107834 A1 | 4/2009 | Ye et al. |
| 2009/0230375 A1 | 9/2009 | Liang et al. |
| 2010/0032290 A1 | 2/2010 | Kikuchi et al. |
| 2010/0044665 A1 | 2/2010 | Jedema |
| 2010/0206724 A1 | 8/2010 | Takahashi |
| 2010/0328996 A1 | 12/2010 | Shih et al. |
| 2011/0049456 A1 | 3/2011 | Lung et al. |
| 2011/0140066 A1 | 6/2011 | Liang et al. |

OTHER PUBLICATIONS

Lee et al., "Separate domain formation in Ge2Sb2Te5—SiOx mixed layer," Appl. Phys. Lett. 89,163503 (2006).

Noh, et al., "Modification of Ge2Sb2Te5 by the Addition of SiOx for Improved Operation of Phase Change Random Access Memory," Mater. Res. Soc. Symp. Proc. vol. 888(2006).

Ryu, et al., "SiO2 Incorporation Effects in Ge2Sb2Te5 Films Prepared by Magnetron Sputtering for Phase Change Random Access Memory Devices," Electrochemical and Solid-State Letters, 9(8) G259-G261 (2006).

Yamada, N., "Potential of Ge—Sb—Te Phase-Change Optical Disks for High-Data-Rate Recording," SPIE v.3109, pp. 28-37 (1997).

COMPOSITE TARGET SPUTTERING FOR FORMING DOPED PHASE CHANGE MATERIALS

This application is a divisional of U.S. patent application Ser. No. 13/076,169, filed on 30 Mar. 2011 (now U.S. Pat. No. 8,426,242), which application claims benefit of U.S. Provisional Patent Application Ser. No. 61/438,569, filed 1 Feb. 2011.

PARTIES TO A JOINT RESEARCH AGREEMENT

International Business Machines Corporation, a New York corporation, and Macronix International Corporation, Ltd., a Taiwan corporation are parties to a Joint Research Agreement.

BACKGROUND OF THE INVENTION

1. Field of the Invention

The present invention relates to manufacturing methods for memory devices based on phase change materials including chalcogenide materials, and methods for forming doped chalcogenide materials for use in such devices.

2. Description of Related Art

Phase change based memory materials, like chalcogenide based materials and similar materials, can be caused to change between an amorphous phase and a crystalline phase by application of electrical current at levels suitable for implementation in integrated circuits. The amorphous phase is characterized by higher electrical resistivity than the crystalline phase, which can be readily read to indicate data. These properties have generated interest in using programmable resistive material to form non-volatile memory circuits, which can be read and written with random access.

The change from the amorphous to the crystalline phase is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

Chalcogenides and other phase change materials can be combined with additives to modify conductivity, transition temperature, melting temperature, and other properties of the material. Combining phase change materials with additives is sometimes referred to as "doping with impurities" or adding "dopants." The terms "additive," "dopant" or "impurity" can be used interchangeably in connection with this specification. Representative additives used with chalcogenides include nitrogen, silicon, oxygen, silicon oxide, silicon nitride, copper, silver, gold, aluminum, aluminum oxide, tantalum, tantalum oxide, tantalum nitride, titanium and titanium oxide. See, for example, U.S. Pat. No. 6,800,504 (metal doping), and U.S. Patent Application Publication No. U.S. 2005/0029502 (nitrogen doping). Research has progressed to provide memory devices that operate with low reset current by adjusting the doping concentration in phase change memory.

U.S. Pat. No. 8,363,463 entitled PHASE CHANGE MEMORY HAVING ONE OR MORE NON-CONSTANT DOPING PROFILES, application Ser. No. 12/729,837, filed 23 Mar. 2010, describes the use of additives in chalcogenides for many purposes, and is incorporated by reference as if fully set forth herein. Dielectric additives, particularly silicon oxides and silicon nitrides which have been widely proposed for use with GST based chalcogenides, are difficult to implement in a way that produces sufficient yield for manufacturing. For example, co-sputtering using silicon oxide target and a chalcogenide target, while adjusting the powers applied to the two targets can be used to create silicon oxide doped chalcogenides. For example, see Ryu, et al., "$SiO_2$ Incorporation Effects in $Ge_2Sb_2Te_5$ Films Prepared by Magnetron Sputtering for Phase Change Random Access Memory Devices," Electrochemical and Solid-State Letters, 9 (8) G259-G261 (2006); Lee et al., "Separate domain formation in $Ge_2Sb_2Te_5$—SiOx mixed layer," Appl. Phys. Lett. 89, 163503 (2006); Czubatyj et al., "Current Reduction in Ovonic Memory Devices," E*PCOS06 (2006); Noh et al., "Modification of Ge2Sb2Te5 by the Addition of SiOx for Improved Operation of Phase Change Random Access Memory," Mater. Res. Soc. Symp. Proc. Vol. 888 (2006), all of which described use of co-sputtering. A U.S. Patent Application Publication by Liang et al. (US 2009/0078924, published 26 Mar. 2009) describes formation of silicon oxide doped chalcogenides using reactive co-sputtering with a single element silicon target and a GST target, while adding oxygen using oxygen gas in the sputter chamber, at paragraph [0024] on page 2.

In connection with nitride compound additives, prior art U.S. Pat. No. 6,501,648, entitled PHASE CHANGE MATERIALS AND ASSOCIATED MEMORY DEVICES, by Chen et al., describes prior art co-sputtering, compound sputtering, and single element target, reactive sputtering techniques at Column 5, lines 54-63.

However, particles are produced in the co-sputtering process and the compound target process for dielectric additives, which contaminate the surface of the wafer and reduce yield.

Although substantial benefits in yield can be achieved using additives, issues remain concerning the manufacture of doped chalcogenides in a reliable and cost effective manner.

It is therefore desirable to provide memory cells addressing the yield, endurance, and data retention issues discussed above.

SUMMARY

A method for forming a layer of phase change material with a silicon or other semiconductor, or a silicon-based or other semiconductor-based additive is described based on the use of a composite sputter target including the silicon or other semiconductor, and the phase change material, and wherein the concentration of silicon or other semiconductor is more than five times greater than the specified concentration of silicon or other semiconductor in the layer being formed. For silicon-based additive in GST type phase change materials, sputter target may comprise more than 30 atomic percent (at %) silicon and preferably between 40 and 60 at % silicon.

The method includes forming a layer of material using a sputter target, where the sputter target has the characteristics mentioned above. A substrate is mounted in a sputtering chamber with the sputter target, and conditions are applied to induce sputtering. In order to form a silicon-based additive such as silicon oxide or silicon nitride, a reactive gas of oxygen or nitrogen is added to the chamber during a sputtering process. The concentrations of oxygen or nitrogen are set based on the specified concentrations desired in the layer being formed.

Multilayer embodiments can be formed, where a one of the multiple layers is formed using the composite target without a reactive gas, and one or more others of the multiple layers are formed using the composite target with a reactive gas. Thus, bi-layer of a silicon doped GST and a silicon oxide doped GST can be formed in a single sputter chamber. Other combinations of semiconductor and semiconductor-based additives can be formed using a single chamber and single sputter target, by controlling the flow of reactive gases.

A memory device can be formed using the layer of memory material formed as described herein.

A sputter target that comprises the backing plate and a target is described. The target comprises a phase change material such as GST, and at least 30 at % silicon or other semiconductor.

Other aspects and advantages of the technology described herein can be seen on review of the drawings, the detailed description in the claims which follow.

DETAILED DESCRIPTION

A detailed description of embodiments of the present invention is provided with reference to the FIGS. 1-14.

Figure 1:
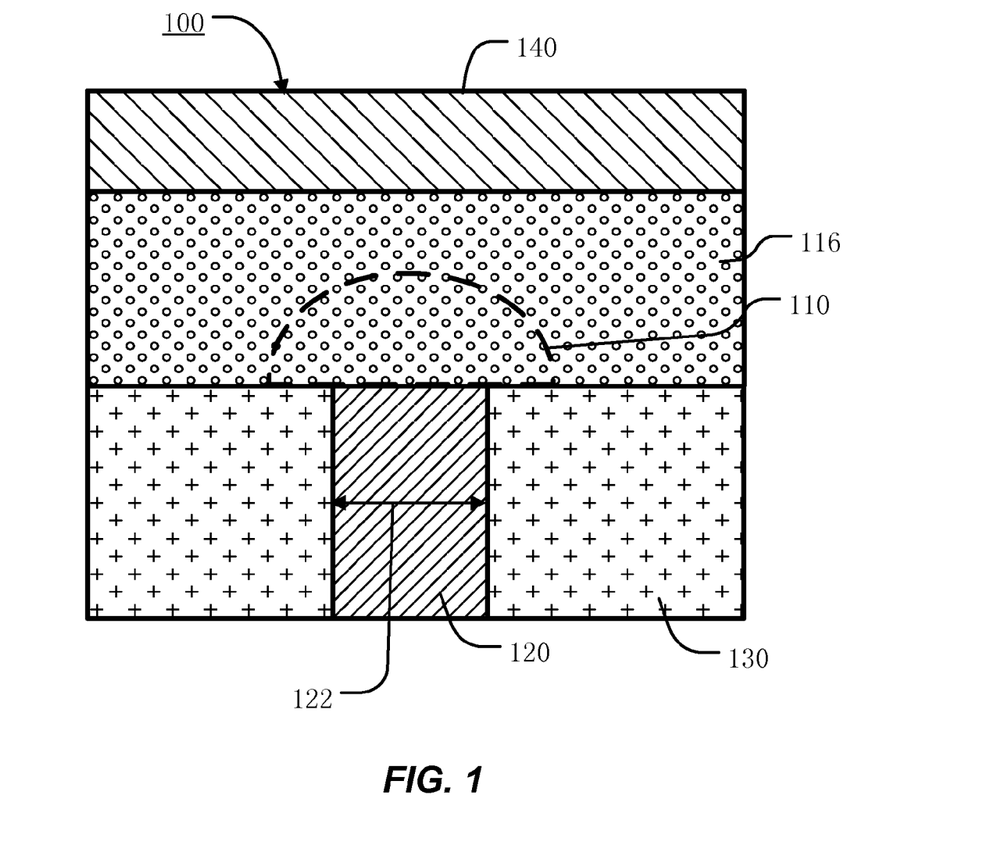
FIG. 1 is a simplified cross-section of a phase change memory cell, having a dielectric doped GST memory layer.

FIG. 1 illustrates a cross-sectional view of a memory cell 100 including a memory element 116 consisting of a body of phase change material having an additive such as silicon, silicon oxide or silicon nitride, along an inter-electrode current path through memory element 116. The memory cell includes an active region 110. The memory cell 100 includes a first electrode 120 extending through dielectric layer 130 to contact a bottom surface of the memory element 116, and a second electrode 140 on the memory element 116. The first and second electrodes 120, 140 may comprise, for example, TiN or TaN. Alternatively, the first and second electrodes 120, 140 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof In the illustrated embodiment, the dielectric layer 130 may comprise silicon nitride, silicon oxynitride, silicon oxide and other materials.

As can be seen in FIG. 1, the relatively narrow width 122 (which in some embodiments is a diameter) of the first electrode 120 results in an area of contact between the first electrode and the memory element that is less than the area of contact between the memory element 116 and the top electrode 140. Thus, current is concentrated in the portion of the memory element 116 adjacent the first electrode 120, resulting in the active region 110 in contact with or near the first electrode 120, as shown. The memory element 116 also includes an inactive region outside the active region 110, which is inactive in the sense that it does not undergo phase transitions during operation. The memory element includes a basis phase change material.

The basis phase change material of memory element 116 in this example comprises $Ge_2Sb_2Te_5$. The basis material can be defined as the combination of elements selected as the phase change material, and deposited with a concentration profile that is characteristic of that material. As additives are combined, the concentrations of the elements of the basis material do not change relative to one another.

Other basis phase change materials may be used, including $Ge(x)Sb(2y)Te(x+3y)$, where x and y are integers (including 0). Other basis phase change materials other than GeSbTe-based materials can also be used, including GaSbTe system, which can be described as $Ga(x)Sb(x+2y)Te(3y)$, and x, y are integers. Alternatively, the basis phase change material can be selected from an $Ag(x)In(y)Sb_2Te_3$ system, where x, y decimal numbers that can be below 1.

In yet other embodiments, a non-constant additive concentration profile using a composite doping of silicon oxide and silicon can be formed. For example, a silicon oxide additive to the phase change material at the interface between the bottom, first electrode 120 and the memory element 116 may have a Si concentration of about 5 at % +/−2 at %, and an O concentration of about 10 at % +/−4 at %. The maximum silicon additive in this example is between about 1 to 5 at % in addition to the silicon that is counted part of the silicon dioxide. Thus, a consolidated concentration profile for the elements silicon and oxygen, along with the GST basis material can include 10 at % silicon, 10 at % oxygen and 80 at % for the combination of the elements of GST. It is found that silicon additives improve retention time and endurance, but can retard set time. Putting higher concentrations of silicon within the active region 110 can improve retention in the active region, while for regions far away from the active region 110 do not significantly impact retention. Also, the reduction of silicon doping away from the active region may reduce the overall resistance of the memory cell, and improve the ability to scale the technology to lower and lower operating voltages.

Figure 2:
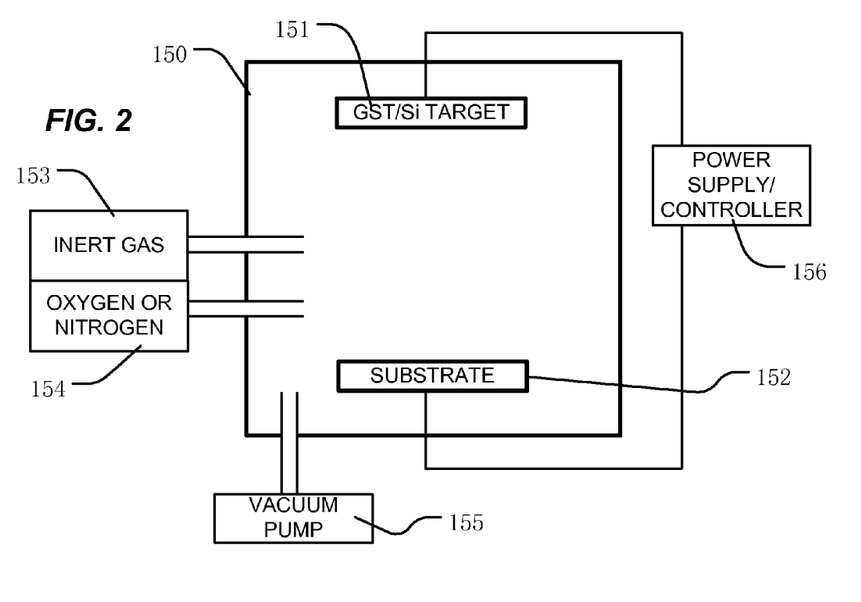
FIG. 2 is a simplified diagram of a sputtering chamber including the composite target described herein.

FIG. 2 is a simplified diagram of a sputtering system, also known as a physical vapor deposition system, which can be used with a composite target described herein. The sputtering system includes a chamber 150 in which a sputter target 151 and a substrate 152 are mounted. The sputter target 151 and substrate 152 are coupled to a power supply and controller 156 used to apply bias voltages during the sputtering process. Bias voltages applied can be DC, pulsed DC, radio frequency, and combinations thereof, and turned on and off and modulated by the controller, as suits a particular sputtering process. The sputter chamber 150 is equipped with a vacuum pump 155 or other means for evacuating the chamber and removing exhaust gases. Also, the chamber is configured with a source 153 of inert gas, such as argon and a source 154 of the reaction gas, such as oxygen or nitrogen in the examples described here. The system has the ability to dynamically control the flow of gases from the sources 153, 154 in order to have an effect on the composition of the layer being formed in the sputtering process. The sputter target 151 comprises a composite of phase change material and silicon, and acts as a source of material used to form a layer on a substrate 152. It will be appreciated that this is a simplified diagram sufficient for heuristic purposes of description herein. Sputter chambers are standard equipment in semiconductor manufacturing factories, and available from a variety of commercial sources.

Figure 3:
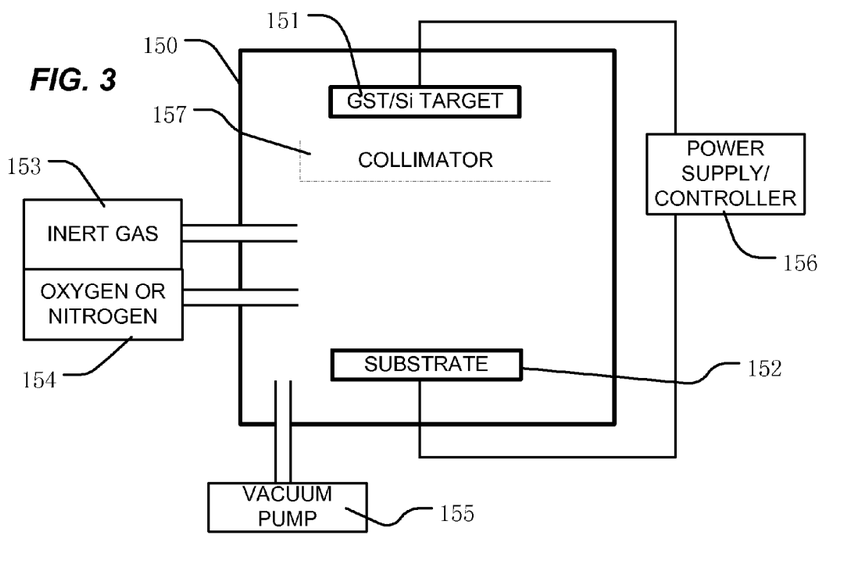
FIG. 3 is simplified diagram of a sputtering chamber including the composite target described herein, with the addition of a collimator.

FIG. 3 is a simplified diagram of an alternative sputtering system, which can also be used with a composite target as described herein. FIG. 3 differs from FIG. 2, in that a collimator 157 is placed between the target 151 and the substrate 152. The collimator 157 can be used when sputtering a substrate that includes high aspect ratio features, to improve the uniformity of coverage over the high aspect ratio features. Some sputtering systems have the ability to move a collimator into and out of the sputtering chamber as needed.

Figure 4A:
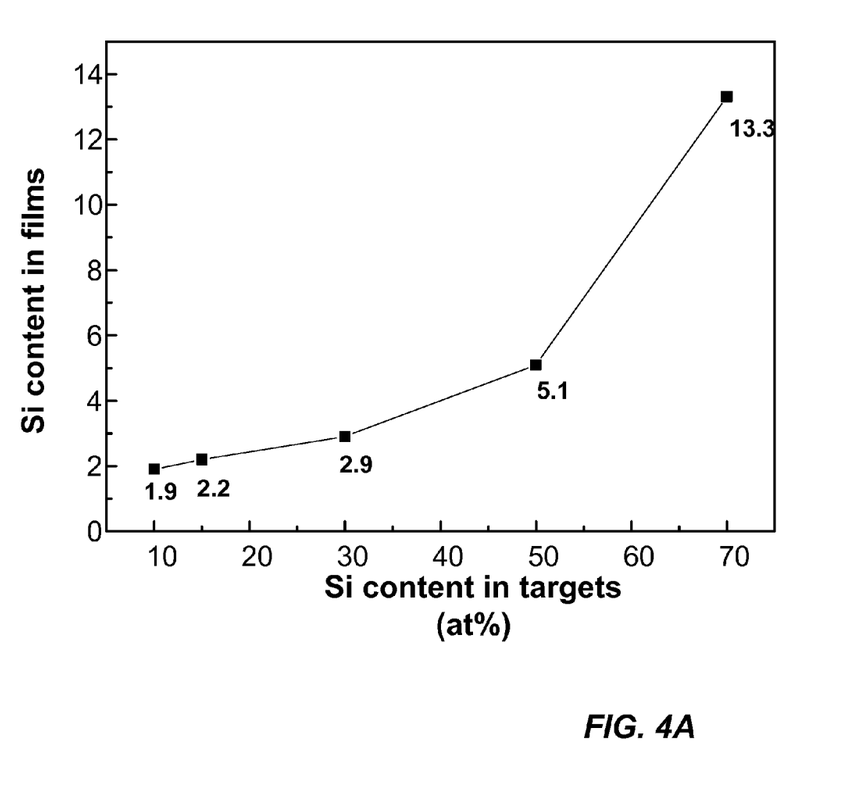
FIG. 4A is a graph showing concentration of silicon in a deposited film on the vertical axis and concentration of silicon in the composite target on the horizontal axis.
Figure 4B:
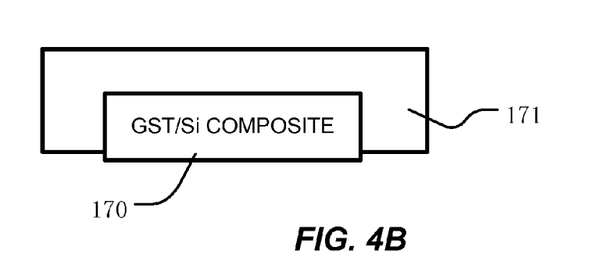
FIG. 4B is a simplified diagram of a sputter target including composite target material as described herein.

Reference to FIGS. 4A and 4B is made to describe the sputter target including a composite of phase change material and silicon. FIG. 4A is a graph of silicon content for a sputter target that is a composite of GST and silicon versus silicon content in the deposited film. As can be seen, in order to achieve silicon content in the phase change film of between 4 and 10 at %, the composite target has between 40 and 60% silicon. In order to achieve a concentration of about 2 at % in a layer being formed, the concentration of silicon in the sputter target must be about five times greater. This ratio increases to on the order of 10 times greater for a specified concentration of silicon of about 3% to 5% in the layer being formed. As the concentration of silicon in the target exceeds about 60%, phase change in the material becomes hard to induce.

It is desirable that the concentration of silicon be on the order of 5% for result-effective formulations of the phase change layer using silicon and GST. Thus, the sputter target is preferably formed with between 30 and 60 at % silicon, yielding between about 4 and about 8 at % silicon in the sputtered layer. It is found that in larger chambers, using larger targets, such as a 13 inch target, a 50 at % silicon target yields 8 at % silicon in the phase change film. Therefore, lower concentrations of silicon in larger targets in the tested chambers, as low as a 30 at % Si target, can be utilized to produce the desired silicon concentration in the deposited film.

FIG. 4B is a simplified diagram of a sputter target according to the present invention. The sputter target includes a sputter plate 170 consisting essentially of a phase change material and silicon composite, and a backing plate 171 which is configured for mounting in the sputter system. In order to make a sputter target as shown in FIG. 4B, the sputter plate 170 can be made, for example, by providing a volume of powder, the volume of powder comprising particles that collectively comprise the phase change material and the additive silicon in the desired proportions. Then, the volume of powder is subjected to one or more mechanical alloying, milling, or blending processes to produce a processed volume. Then the processed volume is consolidated, such as by sintering or other processes to compress and consolidate the processed volume, to produce a sputter plate having the desired composition.

Figure 5:
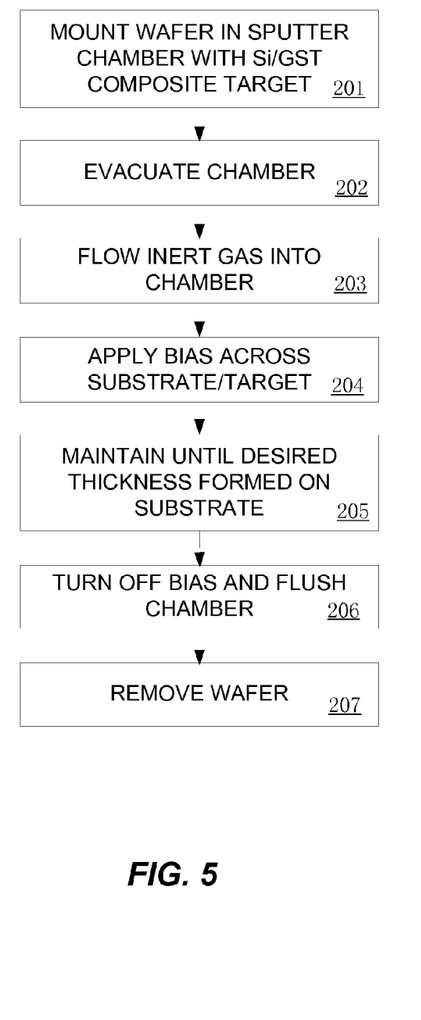
FIGS. 5-8 are simplified flowcharts for manufacturing processes using the composite target described herein.

FIGS. 5-8 illustrate representative manufacturing flows for formation of a phase change layer with a silicon-based additive using a composite target as described above. FIG. 5 illustrates a process flow for forming a layer of phase change material with a silicon additive, so that the layer has between 4 and 8 at % silicon. During manufacturing of an integrated circuit, the wafer is processed to the point of requiring a layer of memory material. The wafer is mounted in a sputter chamber having the silicon/phase change material composite target (201). Next, the chamber is evacuated (202). An inert gas such as argon is flowed into the chamber, to establish an atmosphere suitable for sputtering (203). A bias is applied across the substrate and target, such as a DC bias, to establish an electric field within the sputter chamber necessary to induce the sputtering process (204). Optionally, a pre-sputtering interval can be executed to prepare the target before exposing the wafer to the sputtering atmosphere. The conditions for sputtering are maintained with the wafer exposed, for an interval of time sufficient to obtain the desired thickness of memory material on the substrate (205). The bias is turned off, and the chamber is flushed (206). Finally the wafer is removed (207). Using a composite target, with between 30 and 60 at % silicon, with the balance comprising the phase change material like GST, the resulting layer will have a result effective concentration of silicon, between 4 and 8% for example.

Figure 6:
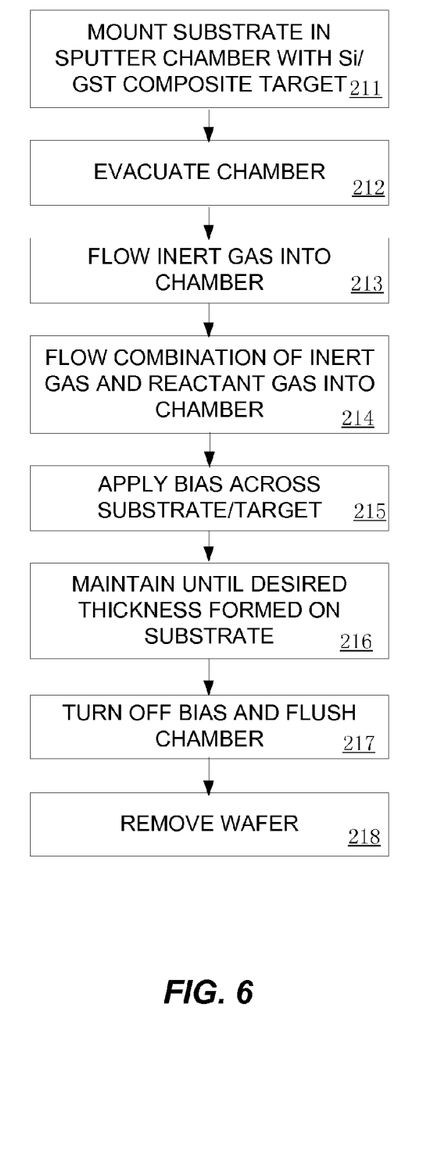

FIG. 6 illustrates a process flow for forming a layer of phase change material with a silicon oxide additive, so that the layer has between 4 and 8 at % silicon with a desired concentration of oxide. During manufacturing of an integrated circuit, the wafer is processed to the point of requiring a layer of memory material. The wafer is mounted in a sputter chamber having the silicon/phase change material composite target (211). Next, the chamber is evacuated (212). An inert gas such as argon is flowed into the chamber, to establish an atmosphere suitable for sputtering (213). Then, the combination of inert gas and reactive gas is flowed into the chamber, where the reactive gas is oxygen in this example and has a flow rate selected to achieve a desired formulation of silicon oxide in the phase change material (214). A bias is applied across the substrate and target, such as a DC bias, to establish an electric field within the sputter chamber necessary to induce the sputtering process (215). Optionally, a pre-sputtering interval can be executed to prepare the target before exposing the wafer to the sputtering atmosphere. The conditions for sputtering are maintained with the wafer exposed, for an interval of time sufficient to obtain the desired thickness of memory material on the substrate (216). The bias is turned off, and the chamber is flushed (217). Finally the wafer is removed (218). Using a composite target, with between 40 and 60 at % silicon, with the balance comprising the phase change material like GST, in combination with the addition of a reactive gas such as oxygen to the chamber at a desired flow rate, such as between 1 and 6 sccm, a resulting layer will have a result effective concentration of silicon oxide, having between 4 and 8 at % silicon, and between 4 and 24 at % oxygen, for example.

Figure 7:
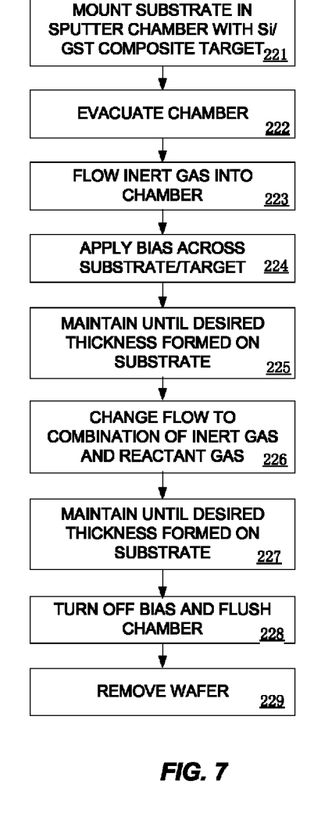

FIG. 7 illustrates a process flow for forming a bi-layer of phase change material, including a first layer with a silicon additive, and a second layer with a silicon oxide additive. During manufacturing of an integrated circuit, the wafer is processed to the point of requiring a layer of memory material. The wafer is mounted in a sputter chamber having the silicon/phase change material composite target (221). Next, the chamber is evacuated (222). An inert gas such as argon is flowed into the chamber, to establish an atmosphere suitable for sputtering (223). A bias is applied across the substrate and target, such as a DC bias, to establish an electric field within the sputter chamber necessary to induce the sputtering process (224). Optionally, a pre-sputtering interval can be executed to prepare the target before exposing the wafer to the sputtering atmosphere. The conditions for sputtering are maintained with the wafer exposed, for an interval of time sufficient to obtain the desired thickness of the first layer of memory material on the substrate (225). In one representative example, a silicon doped GST is formed having a thickness of about 1 to 10 nm in this step. Then, the gas composition in the sputter chamber is changed, with appropriate steps to flush and reconstitute the environment for sputtering, to a combination of inert gas and reactive gas, where the reactive gas is oxygen in this example and has a flow rate selected to achieve a desired formulation of silicon oxide in the phase change material (226). The bias applied across the substrate and target, such as a DC bias, can be kept the same or changed relative to that applied during the sputtering without the reactive gas, to establish an electric field within the sputter chamber necessary to induce the sputtering process. The conditions for sputtering are maintained for an interval of time sufficient to obtain the desired thickness of memory material having the silicon oxide additive on the substrate (227). In the representative embodiment, a silicon oxide doped GST is formed with the thickness between 90 and 100 nm. The bias is turned off, and the chamber is flushed (228). Finally the wafer is removed (229).

Figure 8:
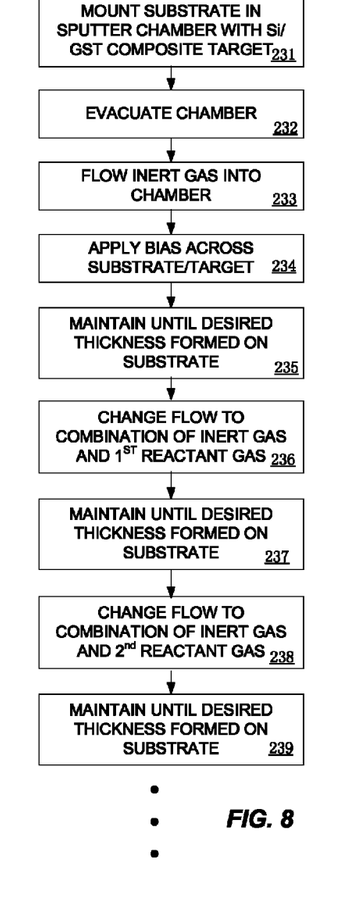

FIG. 8 illustrates a process flow for forming a multi-layer of phase change material, including a first layer with a silicon additive, a second layer with a silicon oxide additive and a third layer with a silicon nitride additive. During manufacturing of an integrated circuit, the wafer is processed to the point of requiring a layer of memory material. The wafer is mounted in a sputter chamber having the silicon/phase change material composite target (231). Next, the chamber is evacuated (232). An inert gas such as argon is flowed into the chamber, to establish an atmosphere suitable for sputtering (233). A bias is applied across the substrate and target, such as a DC bias, to establish an electric field within the sputter chamber necessary to induce the sputtering process (234). Optionally, a pre-sputtering interval can be executed to prepare the target before exposing the wafer to the sputtering atmosphere. The conditions for sputtering are maintained with the wafer exposed, for an interval of time sufficient to obtain the desired thickness of the first layer of memory material on the substrate (235). Then, the gas composition in the sputter chamber is changed, while the bias is turned off, to a combination of inert gas and reactive gas, where the reactive gas is oxygen in this example and has a flow rate selected to achieve a desired formulation of silicon oxide in the phase change material (236). The bias applied across the substrate and target, such as a DC bias, can be kept the same or changed relative to that applied during the sputtering without the reactive gas, to establish an electric field within the sputter chamber necessary to induce the sputtering process. The conditions for sputtering are maintained for an interval of time sufficient to obtain the desired thickness of memory material having the silicon oxide additive on the substrate (237). Then, the gas composition in the sputter chamber is changed, while the bias is turned off, to a combination of inert gas and a second reactive gas, where the reactive gas is nitrogen in this example and has a flow rate selected to achieve a desired formulation of silicon nitride in the phase change material (238). The bias applied across the substrate and target, such as a DC bias, can be kept the same or changed relative to that applied during the sputtering without the reactive gas or with the first reactive gas, to establish an electric field within the sputter chamber necessary to induce the sputtering process. The conditions for sputtering are maintained for interval of time sufficient to obtain the desired thickness of memory material having the silicon oxide additive on the substrate (239). Though not shown in FIG. 8, the bias is turned off, the chamber is flushed, and the wafer is removed.

The process flows illustrated in FIGS. 5-8 are representative of a variety of combinations of processes that can be applied using the composite target, and allowing for formulation of multilayer memory elements using a single composite sputter target, and single sputter chamber.

Figure 9:
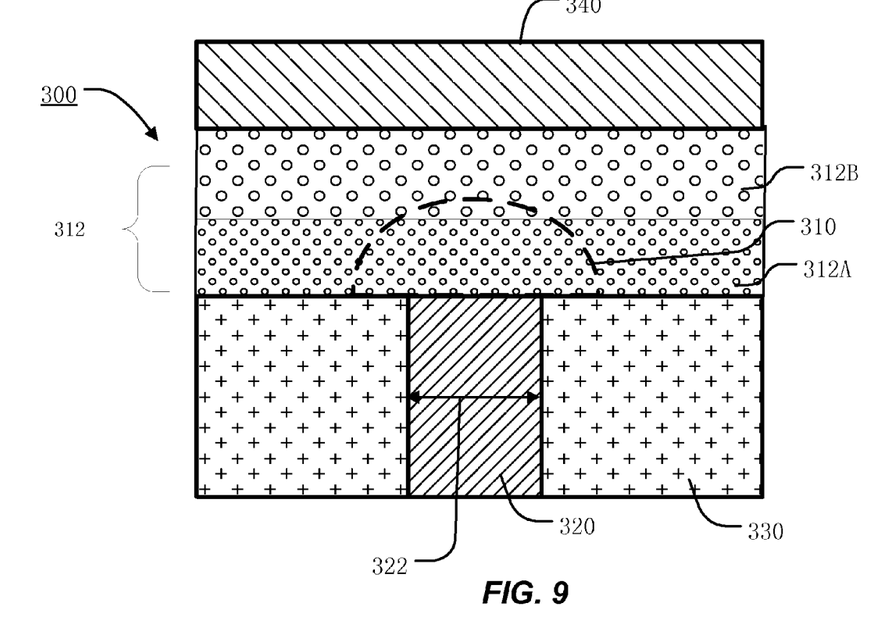
FIG. 9 is a simplified cross-section of a phase change memory cell, having a memory layer with two zones having different dopant profiles, manufactured as described herein.

For example, a memory cell such as shown in FIG. 9 could be manufactured using a one chamber sputtering process with a composite silicon/phase change target. The memory cell 300 in FIG. 9 has a bottom electrode 320 which extends through a dielectric layer 330 from underlying access structures. The memory material in bi-layer 312 consists of a first layer of phase change material 312A, that comprises a phase change material with a silicon additive, and a second layer 312B that comprises a combination of the phase change material and silicon oxide for example. A top electrode 340 is formed on top of the bi-layer 312. The active region 310 memory cell occurs primarily in the first layer 312A of the bi-layer 312, and has a size that is determined in part by the width 322 of the bottom electrode 320. The bi-layer memory element can be made according to the process of FIG. 7 described above.

Figure 10:
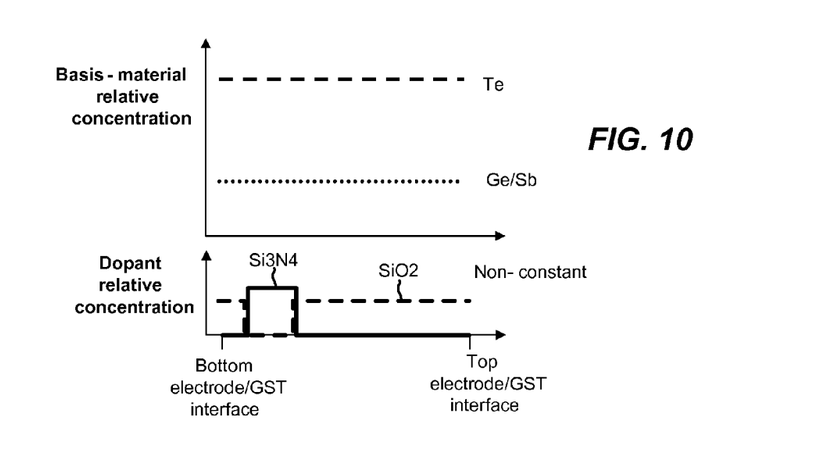
FIG. 10 is a graph of concentration profiles of a memory material and plural dopants manufactured using a composite sputter target as described herein.

FIG. 10 is a graph of concentrations of the basis phase change material on the vertical axis versus depth in the deposited layer on the horizontal axis, illustrating a more complex doping profile that can be implemented using a process like that of FIG. 8. As can be seen, the relative concentrations of the basis phase change material are essentially constant throughout the thickness of the memory layer. The doped relative concentrations illustrate formation of a silicon oxide doped layer adjacent the bottom electrodes for a first step, followed by a silicon nitride doped layer, and then followed again by another silicon oxide doped layer to the top electrode. This multilayer structure can be implemented using a single composite silicon/phase change sputter target while changing the reactive gases during the deposition process to change between silicon oxide and silicon nitride doped layers. The silicon oxide additive of the phase change material at the interface between the bottom electrode and the memory element may have an Si concentration of about 5 at % +/−2 at %, and an O concentration of about 10 at % +/−4 at %. The maximum silicon nitride additive in this example may have 5 at % +/−2 at % for silicon, and 8.3 at % +/−3.3 at % for nitride. It is found that SiN-doped GST provides better retention time than SiO-GST, but the device fails earlier than SiO-GST. The embodiment of FIG. 10 is proposed for better endurance and retention than when the entire active region is constantly doped with SiN, by doping the interface zones adjacent the first and second electrodes with SiO, doping the active region with SiN without significant contribution of SiO in the region. Also the bulk region between the SiN doped region and the interface region at the top electrode is doped only with $SiO_2$ in this example.

Figure 11:
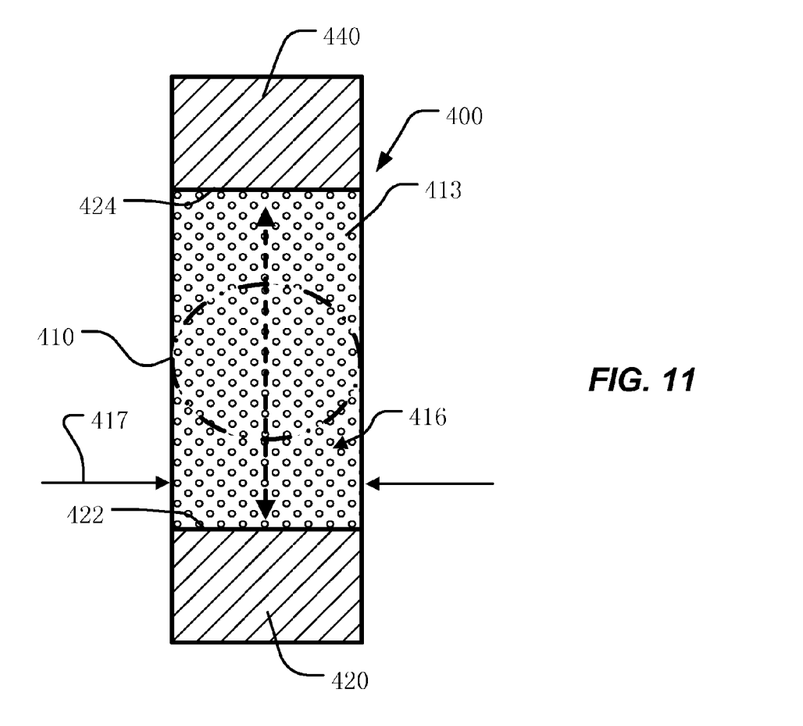
FIG. 11 is a schematic diagram of another embodiment of a memory cell having a phase change memory element manufactured using a composite sputter target described herein.

FIG. 11 illustrates a cross-sectional view of a memory cell 400 including a memory element 416 consisting of a body of phase change material having a silicon based additive in an inter-electrode current path through memory element 416. A process for manufacturing a memory cell such as shown in FIG. 11 could include using a collimator in the sputtering chamber as shown in FIG. 3, along with a process flow like one of FIGS. 5-8 as suits the particular implementation.

The memory cell 400 includes a pillar-shaped memory element 416 contacting first and second electrodes 420, 440 at top and bottom surfaces 422, 424, respectively.

The memory element 416 has a width 417 substantially the same as that of the first and second electrodes 420, 440 to define a multi-layer pillar surrounded by dielectric (not shown). As used herein, the term "substantially" is intended to accommodate manufacturing tolerances. In operation, as current passes between the first and second electrodes 420, 440 and through the memory element 416, the active region 410 heats up more quickly than the remainder (e.g. inactive region 413) of the memory element.

Figure 12:
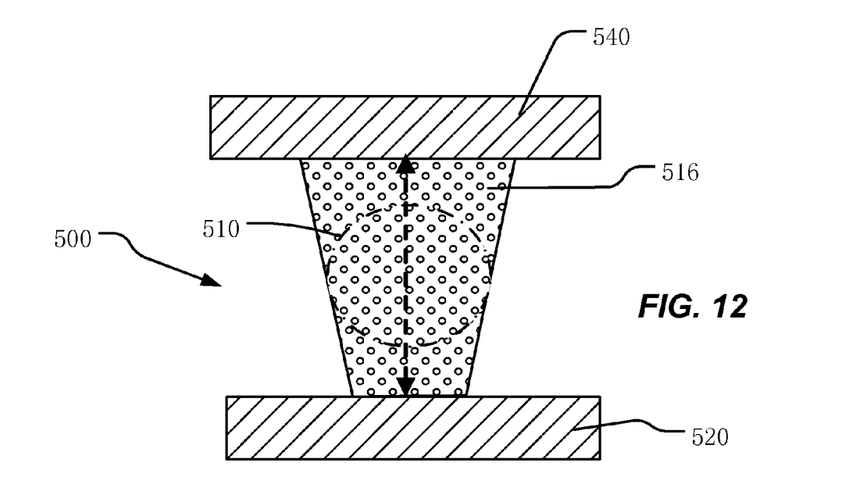
FIG. 12 is a schematic diagram of yet another embodiment of a memory cell having a phase change memory element manufactured using a composite sputter target described herein.

FIG. 12 illustrates a cross-sectional view of a memory cell 500 including a memory element 516 consisting of a body of phase change material with a silicon based additive. A process for manufacturing a memory cell such as shown in FIG. 11 could include using a collimator in the sputtering chamber as shown in FIG. 3, along with a process flow like one of FIGS. 5-8 as suits the particular implementation.

The memory cell 500 includes a pore-type memory element 516 surrounded by dielectric (not shown) contacting first and second electrodes 520, 540 at top and bottom surfaces respectively. The memory element has a width less than that of the first and second electrodes, and in operation as current passes between the first and second electrodes and through the memory element the active region 510 heats up more quickly than the remainder of the memory element.

As will be understood, the memory material formed as described herein can be used in a variety of memory cell structures, not limited to the memory cell structures described herein.

Figure 13:
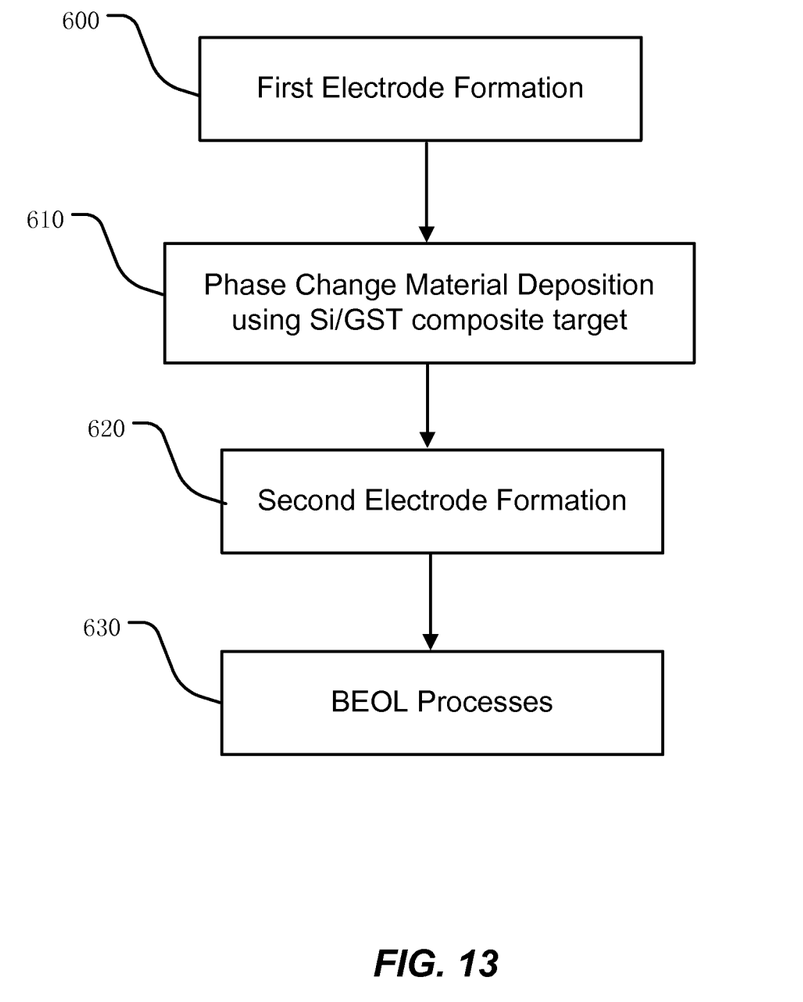
FIG. 13 is a simplified diagram of a manufacturing process using phase change materials manufactured using a composite sputter target as described herein.

FIG. 13 illustrates a manufacturing process for manufacturing a memory cell having a non-constant additive concentration profile as described herein, having a structure like that of FIG. 1. Reference numerals applied to elements of the memory cell correspond to those used in FIG. 1.

At step 600 the first electrode 120 having a width or diameter 122 is formed extending through dielectric layer 130. In the illustrated embodiment, the first electrode 120 comprises TiN and the dielectric layer 130 comprises SiN. In some embodiments the first electrode 120 has a sublithographic width or diameter 122.

The first electrode 120 extends through dielectric layer 130 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 120 and the dielectric layer 130 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Publication 2008/0191187), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 120. Next, the mask of photoresist is trimmed, using for example oxygen plasma, to form a mask structure having sublithographic dimensions overlying the location of the first electrode 120. Then the layer of electrode material is etched using the trimmed mask of photoresist, thereby forming the first electrode 120 having a sublithographic diameter 122. Next dielectric material is formed and planarized for form dielectric layer 130.

As another example, the first electrode 120 and dielectric layer 130 can be formed using methods, materials, and processes as disclosed in U.S. patent application Ser. No. 11/855,979 filed on 14 Sep. 2007 entitled "Phase Change Memory Cell in Via Array with Self-Aligned, Self-Converged Bottom Electrode and Method for Manufacturing" (now U.S. Publication 2009/0072215) which is incorporated by reference herein. For example, the dielectric layer 130 can be formed on the top surface of access circuitry followed by sequentially forming an isolation layer and a sacrificial layer. Next, a mask having openings close to or equal to the minimum feature size of the process used to create the mask is formed on the sacrificial layer, the openings overlying the location of the first electrode 120. The isolation layer and the sacrificial layers are then selectively etched using the mask, thereby forming a via in the isolation and sacrificial layers and exposing a top surface of the dielectric layer 130. After removal of the mask, a selective undercutting etch is performed on the via such that the isolation layer is etched while leaving the sacrificial layer and the dielectric layer 130 intact. A fill material is then formed in the via, which, due to the selective undercutting etch process, results in a self-aligned void in the fill material being formed within the via. Next, an anisotropic etching process is performed on the fill material to open the void, and etching continues until the dielectric layer 130 is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric layer 130 is etched using the sidewall spacers as an etch mask, thereby forming an opening in the dielectric layer 130 having a diameter less than the minimum feature size. Next, an electrode layer is formed within the openings in the dielectric layer 130. A planarizing process, such as chemical mechanical polishing CMP, is then performed to remove the isolation layer and the sacrificial layer and to form the first electrode 120.

At step 610 a phase change element is formed, comprising a basis phase change material such as $Ge_2Sb_2Te_5$, having one or more of a silicon, silicon oxide and silicon nitride additive, by sputtering as described above using a composite target with 40 to 60 at % silicon.

Next, at step 620 a second electrode is formed and at step 630 back-end-of-line (BEOL) processing is performed to complete the semiconductor process steps of the chip, resulting in the structure illustrated in FIG. 1. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 14 are formed on the device.

Figure 14:
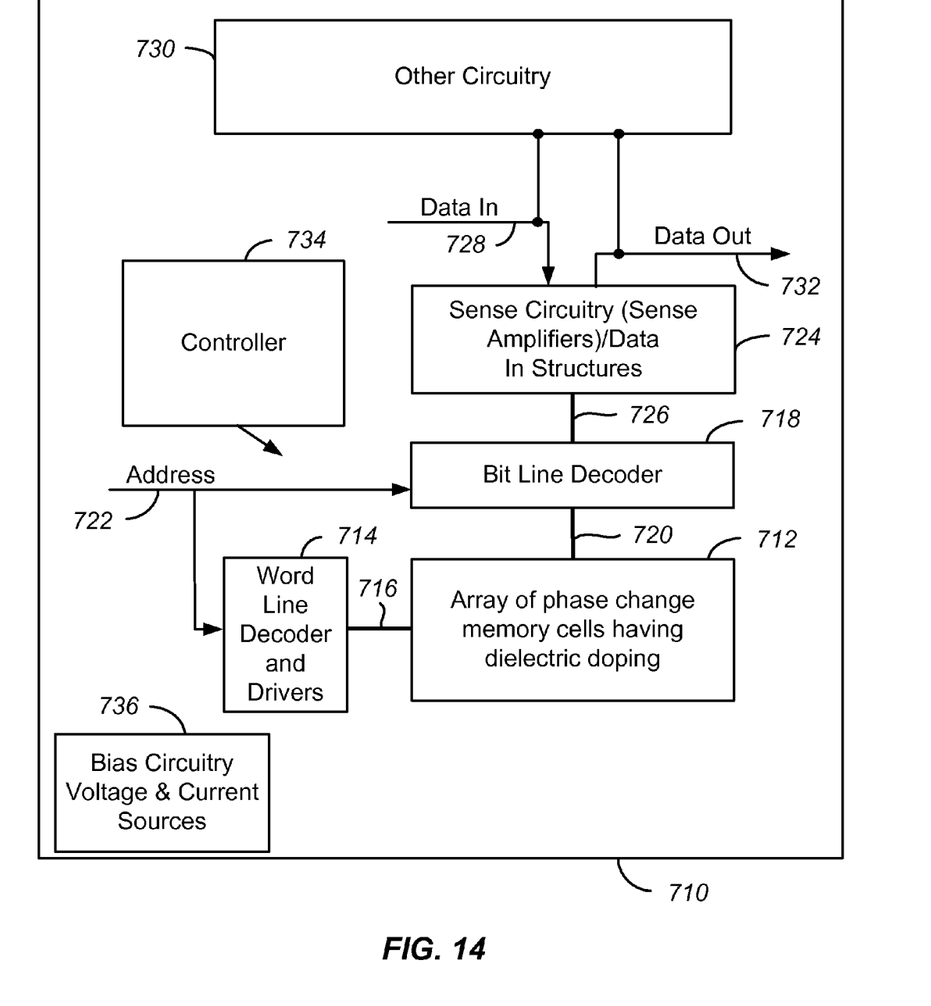
FIG. 14 is a schematic diagram of an integrated circuit memory device including an array of phase change memory cells having non-constant additive profiles.

FIG. 14 is a simplified block diagram of an integrated circuit 710 including a memory array 712 implemented using memory cells having a non-constant additive concentration profile as described herein. A word line decoder 714 having read, set and reset modes is coupled to and in electrical communication with a plurality of word lines 716 arranged along rows in the memory array 712. A bit line (column) decoder 718 is in electrical communication with a plurality of bit lines 720 arranged along columns in the array 712 for reading, setting, and resetting the phase change memory cells (not shown) in array 712. Addresses are supplied on bus 722 to word line decoder and drivers 714 and bit line decoder 718. Sense circuitry (Sense amplifiers) and data-in structures in block 724, including voltage and/or current sources for the read, set, and reset modes are coupled to bit line decoder 718 via data bus 726. Data is supplied via a data-in line 728 from input/output ports on integrated circuit 710, or from other data sources internal or external to integrated circuit 710, to data-in structures in block 724. Other circuitry 730 may be included on integrated circuit 710, such as a general purpose processor or special purpose application circuitry, or a combination of modules providing system-on-a-chip functionality supported by array 712. Data is supplied via a data-out line 732 from the sense amplifiers in block 724 to input/output ports on integrated circuit 710, or to other data destinations internal or external to integrated circuit 710.

A controller 734 implemented in this example, using a bias arrangement state machine, controls the application of bias circuitry voltage and current sources 736 for the application of bias arrangements including read, program, erase, erase verify and program verify voltages and/or currents for the word lines and bit lines. In addition, bias arrangements for melting/cooling cycling may be implemented. Controller 734 may be implemented using special-purpose logic circuitry as known in the art. In alternative embodiments, controller 734 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 734.

The materials used in the embodiment described herein comprise a basis phase change material of $Ge_2Sb_2Te_5$ having one or more additives. Additives other than those mentioned herein and other chalcogenides may be used as well. Chalcogens include any of the four elements oxygen (O), sulfur (S), selenium (Se), and Tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60%, and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording," SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

As mentioned above, one technique that has been applied for manufacturing silicon oxide doped GST films involves co-sputtering, using a GST target and a silicon oxide target in the same chamber. This process has been applied to successfully manufacture memory devices. However, the yield of this manufacturing step is limited by the fact that particles of silicon oxide are deposited on the film. These particles destroy the memory cells on which they lie, and reduce yield of the manufacturing process. Use of the silicon/phase change composite target described herein with the use of oxygen as a reactive gas during sputtering has been demonstrated to form layers of phase change material having silicon oxide additives which have characteristics that are the same as those produced by co-sputtering. However, the process described herein does not result in formation of particle contaminants and provides significantly improve yield.

In one test, a composite target having 50 at % silicon, with $Ge_2Sb_2Te_5$ phase change material was used to form a layer of silicon oxide doped $Ge_2Sb_2Te_5$. The samples formed were analyzed to determine the relative concentrations of materials. A first sample "(a)COMP" in the table below was formed using an argon flow of about 40 sccm and an oxygen flow of about 2 sccm. A second sample "(b)COMP" in the table below, was formed using an argon flow of about 40 sccm and an oxygen flow of about 4 sccm. The sample labeled "DUAL," was made using additional co-sputtering with a silicon oxide target and a GST target. As can be seen, use of the composite target in the first sample "(a)COMP" yielded layer of about 102.0 nm with a silicon concentration of about 4.7 at % with a oxide concentration of about 10 at %, showing a resulting silicon dioxide additive of about 15 at % in a GST phase change layer. Use of the composite target in the second sample "(b)COMP" yielded a layer of about 102.0 nm with a silicon concentration of about 4.4 at % with an oxide concentration of about 14 at %, showing a resulting oxide rich silicon oxide additive of about 19 at % in a GST phase change layer. The increased oxygen flow resulted in a lower silicon concentration in the resulting layer. Result effective concentrations of silicon and oxygen can be formed using a composite target with a silicon concentration in the range of 40 to 60 at %, and an oxygen flow in the range of 1 to 6 sccm. DC power was utilized for the sputtering processes. In comparison, use of co-sputtering with a 12.5% power division between the silicon dioxide and GST targets, yielded a layer of about 45.8 nm with a silicon concentration of about 5.9 at % and an oxygen concentration of about 22.7 at %.

| | [Ge] at. % | [Sb] at. % | [Te] at. % | [Si] at. % | [O] at. % | t (nm) |
|---|---|---|---|---|---|---|
| (a) COMP.: | 18.6 ± 0.5 | 22.7 ± 5 | 44.0 ± 5 | 4.7 ± 0.5 | 10.0 ± 0.5 | 102.2 ± 5.0 |
| (b) COMP.: | 17.8 ± 0.5 | 22.2 ± 5 | 41.6 ± 5 | 4.4 ± 0.5 | 14.0 ± 0.5 | 101.9 ± 5.0 |
| DUAL: | 16.5 ± 0.5 | 19.9 ± 5 | 35.0 ± 0.5 | 5.9 ± 0.5 | 22.7 ± 0.5 | 45.8 ± 3.0 |

The concentrations in the films were measured using Rutherford Backscattering Spectometry with an error of +/−0.5 at %. Testing of the layers as shown that the material made using the composite sputter target behave in the same manner as those made using co-sputtering, in terms of resistivity versus temperature curves, suggesting that the crystallization temperature and melting temperature remain the same. However, layers are formed using the composite target without silicon dioxide particles, and can be made with substantially greater yields.

Additional testing was carried out using nitrogen as a reactive gas. In these samples, a silicon nitride additive was formed in the GST films. Comparative results between the use of a co-sputtering process and the use of the composite sputtering target is described herein were generated. The table below shows the characteristics of a sample "DUAL" using co-sputtering and a sample "COMP" using the composite target. In the sample "COMP", the nitrogen flow was about 4.5 sccm in the argon flow is about 80 sccm. DC power was utilized for the sputtering processes.

| | [Ge] at. % | [TeSb] at. % | [Si] at. % | [N] at. % | [O] at. % | [Ar] at. % | t (nm) |
|---|---|---|---|---|---|---|---|
| DUAL: | 18.4 ± 0.5 | 62.5 ± 0.5 | 5.9 ± 0.5 | 5.2 ± 0.5 | 7.2 ± 0.5 | 0.8 ± 0.2 | 49.3 ± 5.0 |

| | [Ge] at. % | [Sb] at. % | [Te] at. % | [Si] at. % | [N] at. % | [O] at. % | t (nm) |
|---|---|---|---|---|---|---|---|
| COMP.: | 19.0 ± 0.5 | 22.5 ± 5 | 42.8 ± 5 | 4.6 ± 0.5 | 5.0 ± 0.5 | 6.1 ± 0.5 | 95.3 ± 5.0 |

In these results, the oxygen O and argon Ar readings are not believed to relate to the film composition. Rather they probably arise from other structures in the sample or oxidation of the sample during handling.

Testing of the samples was carried out showing the performance of the films are equivalent, while the yield reduced using the composite target was significantly improved. Also, the speed of operation of a GST material with silicon nitride additive demonstrated faster switching speed than samples produced by co-sputtering. Also, the silicon nitride additive in the GST layer yielded experimental memory layers that have endurance on the order of 10 million cycles or more.

The advantages of using $SiO_2$ doped GST phase-change material for phase-change memory include a decrease in the grain size of phase change material, elimination of the formation of voids inside the phase change material and in the interface, and an overall improvement in chip yield, while maintaining the endurance properties of non-doped phase change materials.

Other materials that can react with oxygen or nitrogen to for oxides and nitrides for example in the deposited film, to form dielectrics, can be used as additives in phase change materials. Composite targets using a semiconductor and a phase change alloy can be made and used as described herein, where the additive in the sputter target is on the order of 5 to 10 times greater than the desired concentration of semiconductor in the deposited film.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A sputter target, comprising a phase change material and at least 30 at % silicon.

2. The sputter target of claim 1, wherein the sputter target includes between 40 at % silicon and 60 at % silicon.

3. The sputter target of claim 1, wherein the sputter target includes $Ge_xSb_yTe_z$, and between 30 at % silicon and 60 at % silicon.

4. The sputter target of claim 3, wherein the sputter target includes $Ge_xSb_yTe_z$, and between 30 at % silicon and 60 at % silicon, where x, y and z are 2, 2 and 5 respectively.

5. An integrated circuit including a phase change memory element including a layer of phase change material with a silicon or silicon based additive, the layer being manufactured using a sputter target comprising a phase change material and silicon, the silicon having a concentration in the target more than 30 at %.

6. The integrated circuit of claim 5, wherein the sputter target includes $Ge_xSb_yTe_z$, and between 30 at % silicon and 60 at % silicon.

7. A sputter target for formation of a layer of phase change material having a specified concentration of an additive element that is reactive with oxygen or nitrogen for formation of a dielectric, the target comprising a phase change material and the additive element, the additive element having a concentration in the target more than five times greater than the specified concentration for the layer.

8. An integrated circuit including a phase change memory element including a layer of phase change material and a dielectric, the dielectric comprising a compound of nitrogen or oxygen and an additive element that is reactive with the nitrogen or oxygen, the additive element having a specified concentration for the layer, the layer being manufactured using a sputter target comprising a phase change material and the additive element, the additive element having a concentration in the target more than five times greater than the specified concentration for the layer.

9. The integrated circuit of claim 8, wherein the sputter target includes $Ge_xSb_yTe_z$, and between 30 at % silicon and 60 at % silicon.

10. The integrated circuit of claim 8, wherein the layer of phase change material and dielectric comprises more than 6 at % silicon oxide.

* * * * *